(12) United States Patent
Yun et al.

(10) Patent No.: US 8,687,450 B2
(45) Date of Patent: Apr. 1, 2014

(54) SEMICONDUCTOR DEVICE

(75) Inventors: Tae Sik Yun, Icheon-si (KR); Kang Seol Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 188 days.

(21) Appl. No.: 13/406,117

(22) Filed: Feb. 27, 2012

(65) Prior Publication Data

US 2012/0218843 A1    Aug. 30, 2012

(30) Foreign Application Priority Data

Feb. 28, 2011 (KR) .................. 10-2011-0017690
Feb. 2, 2012 (KR) .................. 10-2012-0010836

(51) Int. Cl.
  *G11C 7/00* (2006.01)
(52) U.S. Cl.
  USPC ....... 365/222; 365/194; 365/289.05; 365/239
(58) Field of Classification Search
  USPC .............................. 365/222, 194, 189.05, 239
  See application file for complete search history.

(56) References Cited

U.S. PATENT DOCUMENTS

| | | | |
|---|---|---|---|
| 2005/0111282 A1* | 5/2005 | Dono et al. | 365/222 |
| 2006/0087903 A1* | 4/2006 | Riho et al. | 365/222 |
| 2008/0225619 A1* | 9/2008 | Kawabata | 365/222 |
| 2009/0040849 A1* | 2/2009 | Mori et al. | 365/201 |
| 2009/0040851 A1* | 2/2009 | Mori et al. | 365/201 |

\* cited by examiner

*Primary Examiner* — Tuan T. Nguyen
(74) *Attorney, Agent, or Firm* — William Park & Associates Patent Ltd.

(57) ABSTRACT

Provided is a semiconductor device which performs a refresh operation by sequentially counting a refresh address including a main word line address, a mat address, and a sub word line address in order of the main word line address, the mat address, and the sub word line address. The semiconductor device includes a control signal generation unit configured to activate, latch, and output a toggle control signal when a delayed refresh signal is inputted at the initial stage, deactivate and output the toggle control signal after additionally counting a redundancy word line address when counting of the main word line address with respect to the mat address is completed, and then activate, latch, and output the toggle control signal when the delayed refresh signal is inputted.

20 Claims, 5 Drawing Sheets

SEMICONDUCTOR DEVICE

CROSS-REFERENCES TO RELATED APPLICATION

The present application claims priority under 35 U.S.C. §119(a) to Korean application number 10-2011-0017690 filed on Feb. 28, 2011 and 10-2012-0010836 filed on Feb. 2, 2012 in the Korean Intellectual Property Office, which are incorporated herein by reference in its entirety.

BACKGROUND

1. Technical Field

The present invention relates generally to a semiconductor integrated circuit, and more particularly, to a semiconductor device.

2. Related Art

In general, a semiconductor device such as DRAM (Dynamic Random Access Memory) includes memory cells each having a transistor and a capacitor. In the memory cells having such a configuration, a leakage current occurs. Therefore, as the time passes, data stored in the memory cells are lost by the leakage current. Accordingly, the semiconductor device such as DRAM should periodically perform a refresh operation to save the data.

According to a known art, the semiconductor device uses a main word line enable signal for selecting a main word line and a sub word line driving signal for selecting a sub word line as a signal for driving a word line. When performing a refresh operation, the semiconductor device does not toggle a sub word line driving signal for driving a corresponding mat, and main word lines are sequentially recharged according to a main word line enable signal. Accordingly, according to the known art, the semiconductor device reduces a refresh current by removing a toggle current of the sub word line driving signal.

Furthermore, according to a known art, semiconductor devices include a row redundancy word line (hereafter, redundancy word line) for replacing a failed memory cell. Here, the redundancy word line may have an "any-to-any" fuse configuration. In such a case, when the sub word line driving signal is not toggled and a fuse indicating a failed memory cell coincides with a row address while a refresh operation is performed, the activated sub word line driving signal should be deactivated because the corresponding redundancy word line may exist in another mat. That is, the toggle current of the sub word line driving signal is consumed during the refresh operation.

SUMMARY

In an embodiment of the present invention, there is provided a semiconductor device which performs a refresh operation by sequentially counting a refresh address including a main word line address, a mat address, and a sub word line address in order of the main word line address, the mat address, and the sub word line address. The semiconductor device includes a control signal generation unit configured to activate, latch, and output a toggle control signal when a delayed refresh signal is inputted at the initial stage, deactivate and output the toggle control signal after additionally counting a redundancy word line address when counting of the main word line address with respect to the mat address is completed, and then activate, latch, and output the toggle control signal when the delayed refresh signal is inputted. Each mat of the semiconductor device includes a toggle control unit which does not toggle a sub word line driving signal when the activated toggle control signal is inputted in case where a mat select signal of the corresponding mat is activated, and toggles the sub word line driving signal when the deactivated toggle control signal is inputted.

BRIEF DESCRIPTION OF THE DRAWINGS

Features, aspects, and embodiments are described in conjunction with the attached drawings, in which.

DETAILED DESCRIPTION

Hereinafter, a semiconductor device according to the present invention will be described below with reference to the accompanying drawings through exemplary embodiments.

Figure 1:
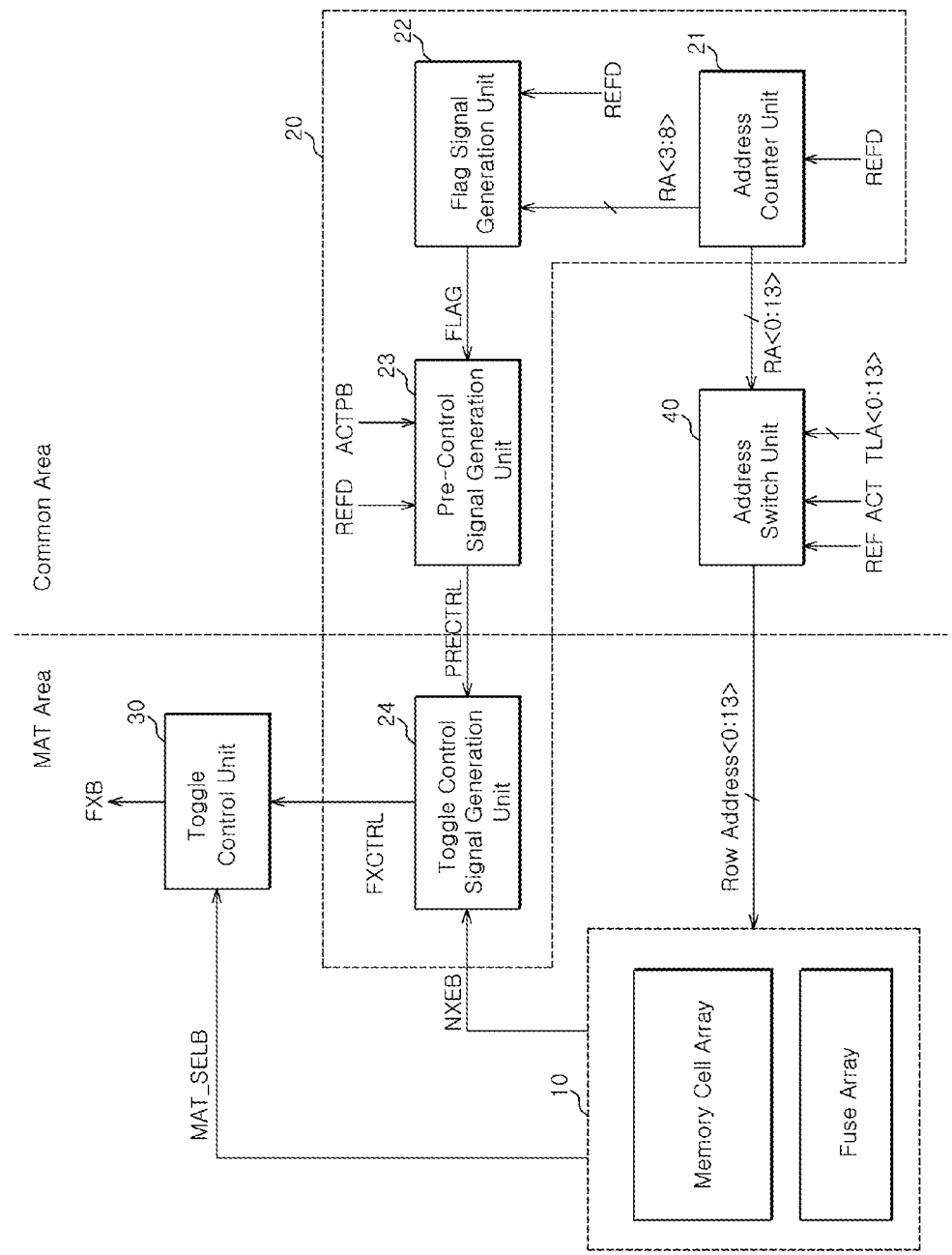
FIG. 1 is a block diagram of a semiconductor device including a sub word line driving signal toggle control circuit according to an embodiment of the present invention.

FIG. 1 is a block diagram of semiconductor device including a sub word line driving signal toggle control circuit according to an embodiment of the present invention.

The sub word line driving signal toggle control circuit includes a control signal generation unit 20 and a toggle control unit 30.

The control signal generation unit 20 is included in a common area of the semiconductor device, and includes an address counter unit 21, a flag signal generation unit 22, a pre-control signal generation unit 23, and a toggle control signal generation unit 24.

The address counter unit 21 is configured to count a refresh address RA<0:13> in response to a delayed refresh signal REFD, and output a main word line address RA<3:8> which is a portion of the refresh address RA<0:13>. The flag signal generation unit 22 is configured to output an activated flag signal FLAG when the delayed refresh signal REFD transits to a low level as the counting of the main word line address RA<3:8> is completed. The pre-control signal generation unit 23 is configured to activate a pre-control signal PRECTRL when the delayed refresh signal REFD is inputted or deactivate the pre-control signal PRECTRL when an active signal ACTPB or the activated flag signal FLAG is inputted. The toggle control signal generation unit 24 is configured to generate an activated toggle control signal FXCTRL when the pre-control signal PRECTRL is activated, and deactivate the toggle control signal FXCTRL when a fuse indicating a failed memory cell coincides with a row address and an activated cell replacement signal NXEB is inputted.

For reference, the cell replacement signal NXEB is a signal applied from a memory cell block 10 including a memory cell array and a fuse array. The memory cell block 10 receives a row address Row Address<0:13> from an address switch unit 40. Here, the address switch unit 40 is configured to output an external address TLA<0:13> as the row address Row Address<0:13> when an external active signal ACT is applied, and outputs the refresh address RA<0:13> as the row address Row Address<0:13> when the refresh signal REF is applied.

The control signal generation unit 20 activates and outputs the toggle control signal FXCTRL until the counting of the main word line address RA<3:8> for the corresponding mat is completed, as long as an active operation is not performed. When a fuse (not illustrated) indicating a failed memory cell coincides with the row address Row Address<0:13> such that the activated cell replacement signal NXEB is applied, the control signal generation unit 20 deactivates the toggle control signal FXCTRL.

The toggle control unit 30 is included in each mat, and configured to control toggling of the sub word line driving signal FXB in response to the toggle control signal FXCTRL and a mat select signal MAT_SELB inputted to the corresponding mat. For example, when the corresponding mat select signal MAT_SELB is activated, the toggle control unit 30 does not toggle the sub word line driving signal FXB in case where the toggle control signal FXCTRL is activated, but toggles the sub word line driving signal FXB in case where the toggle control signal FXCTRL is deactivated.

Therefore, the semiconductor device does not toggle the sub word line driving signal FXB until the counting of the main word line address RA<3:8> for the corresponding mat is completed, but toggles the sub word line driving signal FXB when the activated cell replacement signal NXEB is applied. Therefore, when a failed memory cell is replaced with a redundancy cell, the toggle current is consumed.

Figure 2:
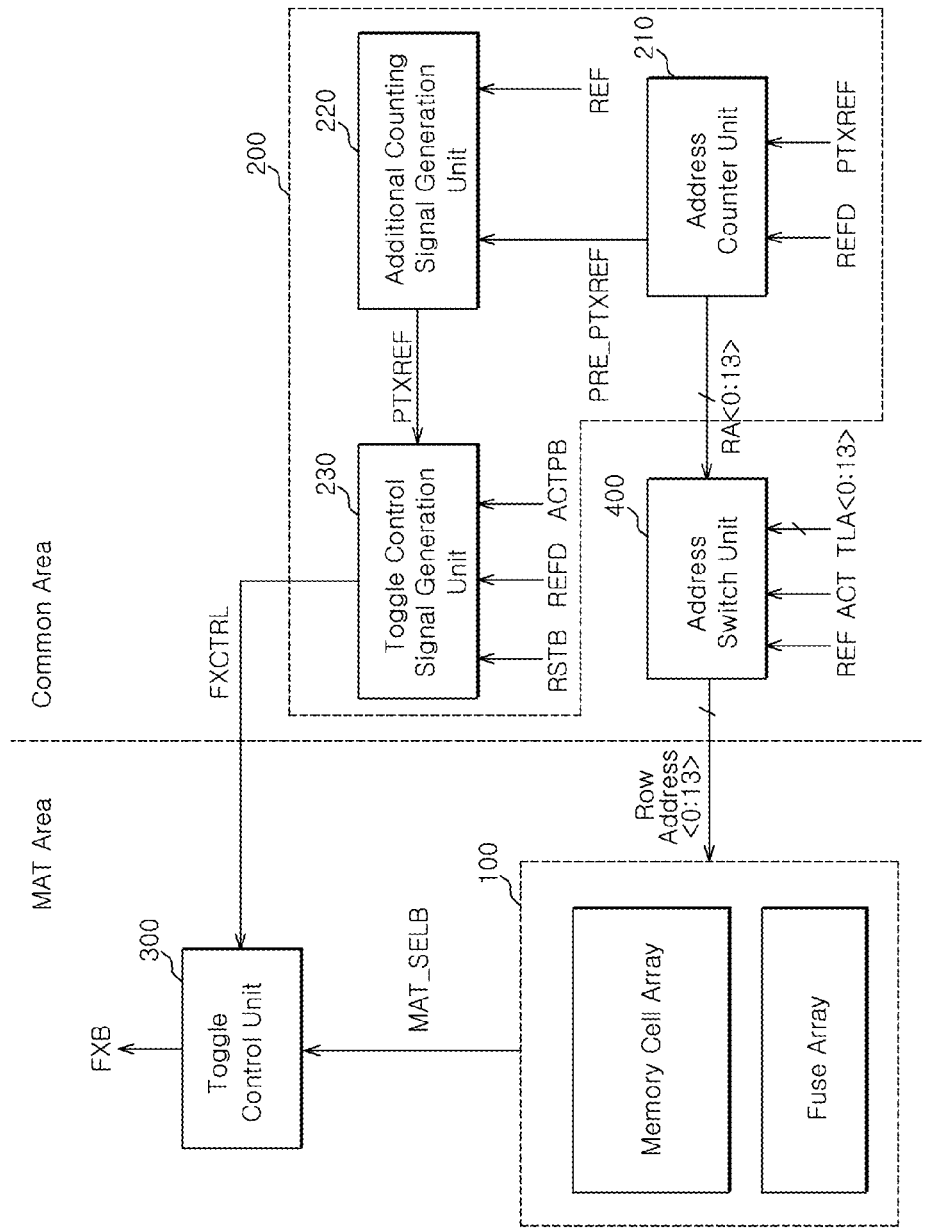
FIG. 2 is a block diagram of a semiconductor device including a sub word line driving signal toggle control circuit according to an embodiment of the present invention.

FIG. 2 is a block diagram of a semiconductor device including a sub word line driving signal toggle control circuit according to an embodiment of the present invention.

The sub word line driving signal toggle control circuit of the semiconductor device according to an embodiment of the present invention includes a control signal generation unit 200 and a toggle control unit 300. The semiconductor device according to an embodiment of the present invention performs a refresh operation by selecting a sub word line of a corresponding mat and sequentially refreshing main word lines. The sub word line driving signal toggle control circuit controls toggling of a sub word line driving signal FXB for deciding whether or not to select the sub word line. For example, the sub word line driving signal toggle control circuit controls the sub word line driving signal FXB not to be toggled while a refresh operation is performed on main word lines of the corresponding mat.

The control signal generation unit 200 includes an address counter unit 210, an additional counting signal generation unit 220, and a toggle control signal generation unit 230.

The address counter unit 210 is configured to sequentially count a refresh address RA<0:13>. The refresh address RA<0:13> may include a main word line address RA<3:8>, a mat address RA<9:12>, and a sub word line address RA<0:2>. In this case, the address counter unit 210 sequentially counts the main word line address RA<3:8>, the mat address RA<9:12>, and the sub word line address RA<0:2>. The address counter unit 210 may additionally count a pre-additional counting signal PRE_PTXREF corresponding to a redundancy word line address between the main word line address RA<3:8> and the mat address RA<9:12>. The counting operation is sequentially performed by receiving a delayed refresh signal REFD according to whether an additional counting signal PTXREF is activated or not.

The delayed refresh signal REFD is obtained by delaying a refresh signal REF by a certain time, and inputted to perform a counting operation for increasing the refresh address RA<0:13> after a refresh operation for the refresh address RA<0:13> is completed. Here, the refresh signal REF is a pulse signal which is inputted in synchronization with a clock signal when the refresh operation is performed.

The address counter unit 210 outputs the pre-additional counting signal PRE_PTXREF. Here, the pre-additional counting signal PRE_PTXREF is activated to a high level when the counting operation of the main word line address RA<3:8> of the corresponding mat is completed.

The additional counting signal generation unit 220 is configured to generate the additional counting signal PTXREF in response to the pre-additional counting signal PRE_PTXREF, when the refresh signal REF is applied. That is, the additional counting signal generation unit 220 generates an activated additional counting signal PTXREF when the pre-additional counting signal PRE_PTXREF is activated, and generates a deactivated additional counting signal PTXREF when the pre-additional counting signal PRE_PTXREF is deactivated, in synchronization with the refresh signal REF.

The toggle control signal generation unit 230 is configured to generate a toggle control signal FXCTRL in response to the delayed refresh signal REFD, an active signal ACTPB, and the additional counting signal PTXREF. Also, the toggle control signal generation unit 230 may reset the toggle control signal FXCTRL to a deactivation state at a low level in response to a reset signal RSTB.

The toggle control signal generation unit 230 activates, latches, and outputs the toggle control signal FXCTRL when the delayed refresh signal REFD is inputted. The toggle control signal generation unit 230, according to an embodiment of the present invention, activates the toggle control signal FXCTRL in response to an activated additional counting signal PTXREF, and deactivates the toggle control signal FXCTRL at a time point where the additional counting signal PTXREF is deactivated. Then, when the delayed refresh signal REFD is applied again, the toggle control signal generation unit 230 activates, latches, and outputs the toggle control signal FXCTRL.

On the other hand, when the activated active signal ACTPB is inputted during the refresh operation, the toggle control signal generation unit 230 deactivates the toggle control signal FXCTRL. That is because activation of the active signal ACTPB means that the semiconductor device stops a refresh operation and performs an active operation. During the active operation, the semiconductor device receives an external address TLA<0:13> through an address switch unit 400 and transmits a row address Row Address<0:13> to a memory cell block 100. The memory cell block 100 including a memory cell array and a fuse array accesses a memory cell or redundancy memory cell in response to the row address Row Address<0:13>. The memory cell block 100 and the address switch unit 400 may be configured in the same manner as the memory cell block 10 and the address switch unit 40 described above.

The control signal generation unit 200 according to an embodiment of the present invention deactivates the toggle control signal FXCTRL after all main word lines and redundancy word lines for the corresponding mat are refreshed, while not toggling the sub word line driving signal FXB.

The toggle control unit 300 is included in each of mats, and configured to control toggling of the sub word line driving signal FXB in response to the toggle control signal FXCTRL and a mat select signal MAT_SELB inputted to the corresponding mat. When the corresponding mat select signal MAT_SELB is activated, the toggle control unit 300 does not toggle the sub word line driving signal FXB in case where the toggle control signal FXCTRL is activated, and toggles the sub word line driving signal FXB in case where the toggle control signal FXCTRL is deactivated.

Here, a plurality of sub word line driving signals FXB may be configured to correspond to the sub word line address RA<0:2>. The above-described control method of the sub word line driving signal FXB for controlling a selected sub word line may be similarly applied to other sub word lines which are sequentially selected as a refresh operation is continuously performed.

The semiconductor device, according to an embodiment of the present invention, deactivates a sub word line driving signal FXB of a corresponding mat, when all main word lines and redundancy word lines of the mat are refreshed while the sub word line driving signal FXB of the mat is in an activation state, that is, when the toggle control signal FXCTRL is deactivated by the activated additional counting signal PTXREF. Then, when the activated toggle control signal FXCTRL is applied again, the semiconductor device activates the sub word line driving signal FXB (e.g., corresponding to a selected sub word line) of the corresponding mat, until all main word lines and redundancy word lines of a mat selected next are refreshed. For example, the sub word line driving signal FXB of a corresponding mat is toggled when all main word lines and redundancy word lines of the mat are refreshed while the sub word line driving signal FXB of the mat is not toggled, that is, when the toggle control signal FXCTRL is deactivated by the activated additional counting signal PTXREF. Then, when the activated toggle control signal FXCTRL is applied again, the semiconductor device does not toggle the sub word line driving signal FXB (e.g., corresponding to a selected sub word line) of the corresponding mat, until all main word lines and redundancy word lines of a mat selected next are refreshed.

Figure 3:
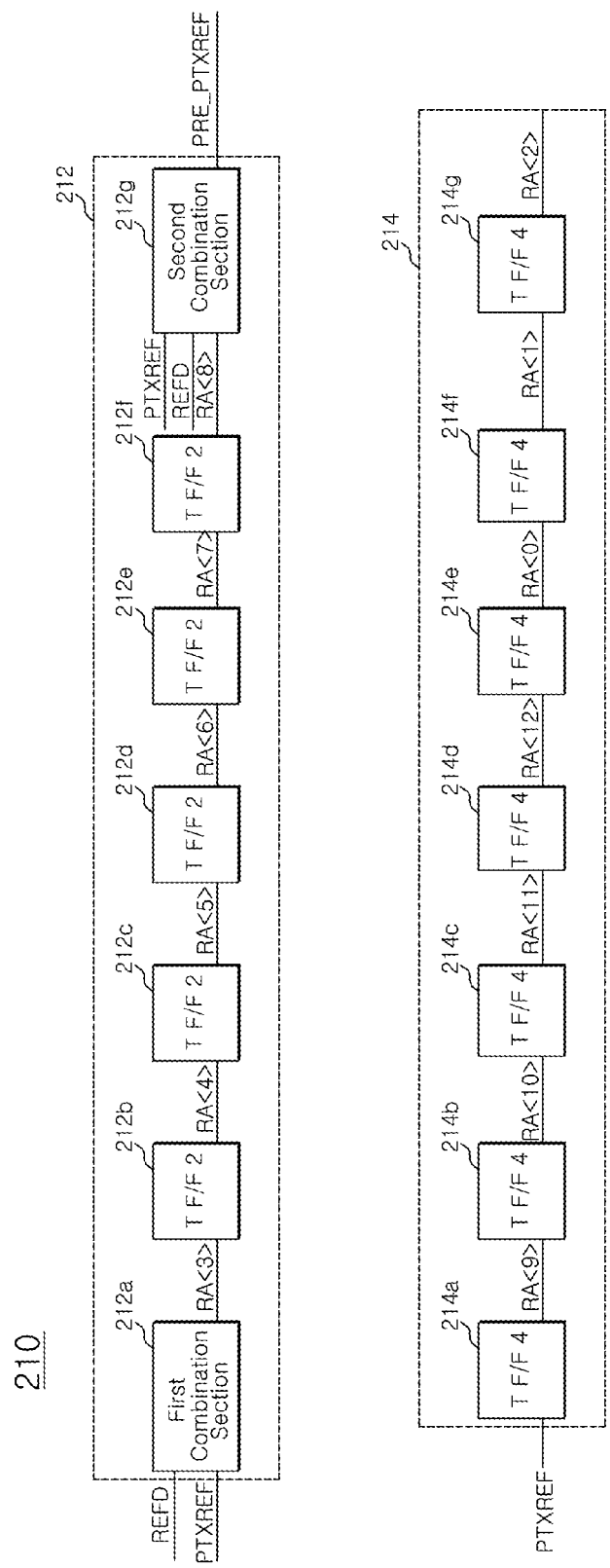
FIG. 3 is a circuit diagram illustrating a specific example of an address counter unit of FIG. 2.

FIG. 3 is a circuit diagram illustrating a specific example of the address counter unit 210.

The address counter unit 210 includes a first counting block 212 and a second counting block 214.

The first counting block 212 includes a first combination section 212a, a plurality of second flip-flops 212b to 212f, and a second combination section 212g.

The first combination section 212a is configured to count a first bit RA<3> of the main word line address in response to the additional counting signal PTXREF and the delayed refresh signal REFD. That is, the first combination section 212a receives the delayed refresh signal REFD according to whether the additional counting signal PTXREF is activated or not, and toggles the first bit RA<3> of the main word line address.

The plurality of second flip-flops 212b to 212f are coupled in series to the first combination section 212a and configured to sequentially count the main word line address RA<3:8> excluding the first bit RA<3>. That is, in an embodiment of the present invention, since the main word line address includes six bits, the five flip-flops 212b to 212f are provided to count the other bits RA<4:8> excluding the first bit RA<3>. The inputs and outputs of the five flip-flops 212b to 212f are coupled in series to the first combination section 212a.

The second combination section 212g is configured to count the pre-additional counting signal PRE_PTXREF in response to the additional counting signal PTXREF, the delayed refresh signal REFD, and the last bit RA<8> of the main word line address. Specifically, the second combination section 212g counts the pre-additional counting signal PRE_PTXREF in response to the delayed refresh signal REFD when the last bit RA<8> of the main word line address is at a high level in case where the deactivated additional counting signal PTXREF is inputted, and counts the pre-additional counting signal PRE_PTXREF in response to the delayed refresh signal REFD in case where the activated additional counting signal PTXREF is inputted.

That is, the first counting block 212 sequentially counts the main word line address RA<3:8> and the pre-additional counting signal PRE_PTXREF.

The second counting block 214 includes a plurality of fourth flip-flops 214a to 214g.

The plurality of fourth flip-flops 214a to 214g are coupled in series and configured to sequentially count the mat address RA<9:12> and the sub word line address RA<0:2> from the additional counting signal PTXREF.

Accordingly, the semiconductor device according to an embodiment of the present invention may not toggle the sub word line driving signals FXB corresponding to the sub word line address RA<0:2> according to the pre-additional counting signal PRE_PTXREF outputted from the address counter unit 210, until all main word lines and redundancy word lines of the corresponding mat are refreshed.

Figure 4:
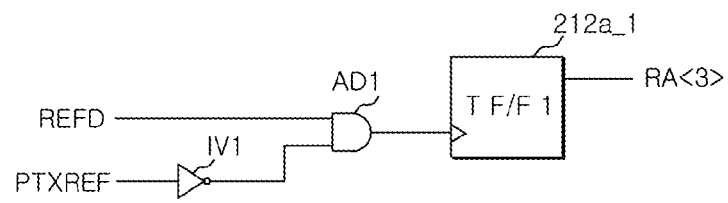
FIG. 4 is a circuit diagram illustrating a specific example of a first combination section of FIG. 3.

FIG. 4 is a circuit diagram illustrating a specific example of the first combination section 212a.

The first combination section 212a includes a first inverter IV1, a first AND gate AD1, and a first flip-flop 212a_1.

The first inverter IV1 is configured to invert the additional counting signal PTXREF.

The first AND gate AD1 is configured to receive an output of the first inverter IV1 and the delayed refresh signal REFD and perform an AND operation on the received signals.

The first flip-flop 212a_1 is configured to toggle the first bit RA<3> of the main word line address in response to an output signal of the first AND gate AD1.

That is, the first combination section 212a toggles the first bit RA<3> of the main word line address whenever the delayed refresh signal REFD is inputted while the additional counting signal PTXREF is deactivated.

Figure 5:
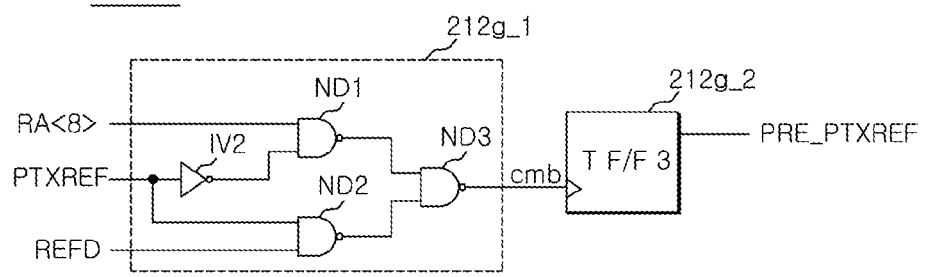
FIG. 5 is a circuit diagram illustrating a specific example of a second combination section of FIG. 3.

FIG. 5 is a circuit diagram illustrating a specific example of the second combination section 212g.

The second combination section 212g includes a sub combination section 212g_1 and a third flip-flop 212g_2.

The sub combination section 212g_1 includes a second inverter IV2, a first NAND gate ND1, a second NAND gate ND2, and a third NAND gate ND3.

The second inverter IV2 is configured to invert the additional counting signal PTXREF.

The first NAND gate ND1 is configured to receive an output of the second inverter IV2 and the last bit RA<8> of the main word line address and perform a NAND operation on the received signals.

The second NAND gate ND2 is configured to receive the additional counting signal PTXREF and the delayed refresh signal REFD and perform a NAND operation on the received signals.

The third NAND gate ND3 is configured to receive output signals of the first and second NAND gates ND1 and ND2, perform a NAND operation on the received signals, and output a combination signal cmb.

That is, the sub combination section 212g_1 outputs an activated combination signal cmb when the last bit RA<8> of the main word line address is at a high level and the delayed refresh signal REFD is inputted in case where the deactivated additional counting signal PTXREF is inputted, and outputs an activated combination signal cmb when the delayed refresh signal REFD is inputted in case where the activated additional counting signal PTXREF is inputted.

The third flip-flop 212g_2 is configured to toggle the pre-additional counting signal PRE_PTXREF in response to the combination signal cmb.

That is, the second combination section 212g toggles the pre-additional counting signal PRE_PTXREF in response to the delayed refresh signal REFD when the last bit RA<8> of the main word line address is at a high level in case where the deactivated additional counting signal PTXREF is inputted, and toggles the pre-additional counting signal PRE_PTXREF in response to the delayed refresh signal REFD in case where the activated additional counting signal PTXREF is inputted.

Accordingly, the address counter unit 210 starts to count the main word line address RA<3:8> in response to the deactivated additional counting signal PTXREF at the initial stage of the refresh operation, and counts the pre-additional counting signal PRE_PTXREF when the main word line address RA<3:8> is counted to the last bit (that is, the pre-additional counting signal PRE_PTXREF is activated). Then, the pre-additional counting signal PRE_PTXREF is toggled and deactivated in response to the activated additional counting signal PTXREF.

Figure 6:
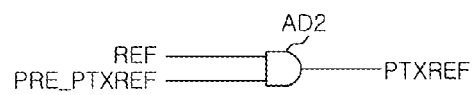
FIG. 6 illustrates a specific example of an additional counting signal generation unit of FIG. 2.

FIG. 6 illustrates a specific example of the additional counting signal generation unit 220.

The additional counting signal generation unit 220 includes a second AND gate AD2.

The second AND gate AD2 is configured to receive the pre-additional counting signal PRE_PTXREF and the refresh signal REF, perform an AND operation on the received signals, and output the additional counting signal PTXREF.

That is, the additional counting signal generation unit 220 activates the additional counting signal PTXREF when the refresh signal REF is inputted in case where the pre-additional counting signal PRE_PTXREF is activated.

Figure 7:
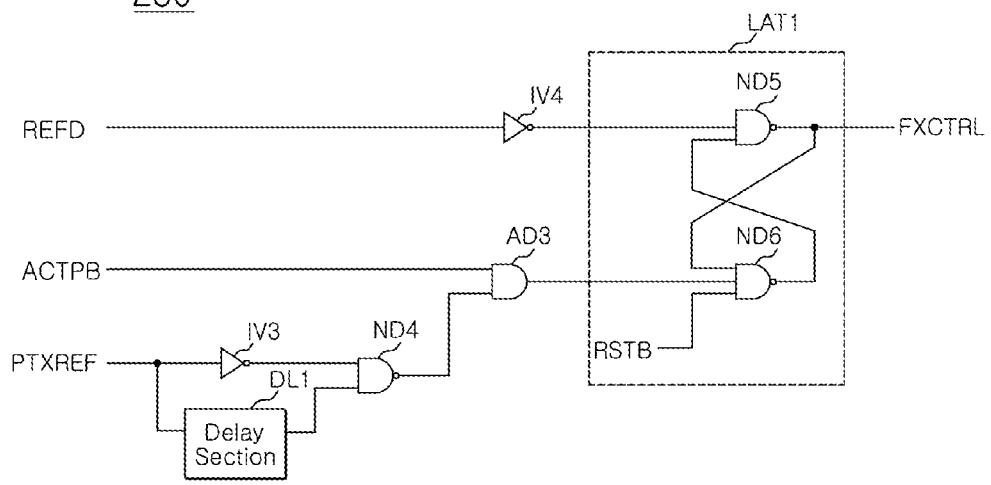
FIG. 7 is a circuit diagram illustrating a specific example of a toggle control signal generation unit of FIG. 2.

FIG. 7 is a circuit diagram illustrating a specific example of the toggle control signal generation unit 230.

The toggle control signal generation unit 230 includes third and fourth inverters IV3 and IV4, a delay section DL1, a fourth NAND gate ND4, a third AND gate AD3, and a first latch section LAT1.

The third inverter IV3 is configured to invert the additional counting signal PTXREF.

The delay section DL1 is configured to delay the additional counting signal PTXREF by a certain time.

The fourth inverter IV4 is configured to invert the delayed refresh signal REFD.

The fourth NAND gate ND4 is configured to receive an output of the third inverter IV3 and an output of the delay section DL1 and perform a NAND operation on the received signals.

The third AND gate AD3 is configured to receive the active signal ACTPB and an output signal of the fourth NAND gate ND4 and perform an AND operation on the received signals.

The first latch section LAT1 is configured to output the toggle control signal FXCTRL in response to an inverted output signal of the fourth inverter 1V4, an output signal of the third AND gate AD3, and a reset signal RSTB.

More specifically, the first latch section LAT1 includes a fifth NAND gate ND5 and a sixth NAND gate ND6.

The fifth NAND gate ND5 is configured to receive the output signal of the fourth inverter 1V4 and an output signal of the sixth NAND gate ND6 and output the toggle control signal FXCTRL.

The sixth NAND gate ND6 is configured to receive an output signal of the third AND gate AD3, the output signal of the fifth NAND gate ND5, and the reset signal RSTB.

The specific operation of the toggle control signal generation unit 230 will be described as follows.

First, when the reset signal RSTB activated to a low level is applied, the toggle control signal generation unit 230 resets the toggle control signal FXCTRL in a deactivation state. Then, when the delayed refresh signal REFD is applied, the toggle control signal generation unit 230 activates, latches, and outputs the toggle control signal FXCTRL. However, when the activated additional counting signal PTXREF and the delayed refresh signal REFD are applied, the toggle control signal generation unit 230 deactivates the toggle control signal FXCTRL at a time point where the additional counting signal PTXREF is deactivated.

When the activated active signal ACTPB is inputted, since a refresh operation is stopped and an active operation is performed, the toggle control signal generation unit 230 deactivates the toggle control signal FXCTRL.

Therefore, the control signal generation unit 200 according to an embodiment of the present invention activates the toggle control signal FXCTRL until all main word lines and redundancy word lines of the corresponding mat are refreshed, during a refresh operation, and then deactivates the toggle control signal FXCTRL after all the refresh operation of all the main word lines and redundancy word lines of the corresponding mat are completed.

Accordingly, the semiconductor device according to an embodiment of the present invention may not toggle the sub word line driving signal FXB in an activation state until all main word lines and redundancy word lines of the corresponding mat are refreshed, during a refresh operation, and then may toggle the sub word line driving signal FXB in a deactivation state. Such an operation is sequentially performed for each mat. Furthermore, this is similarly applied to the toggle control of all sub word line driving signals.

According to an embodiment of the present invention, the current consumed to toggle the sub word line driving signal may be reduced.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device which performs a refresh operation by sequentially counting a refresh address including a main word line address, a mat address, and a sub word line address in order of the main word line address, the mat address, and the sub word line address, the semiconductor device comprising:

a control signal generation unit configured to activate, latch, and output a toggle control signal when a delayed refresh signal is inputted at the initial stage, deactivate and output the toggle control signal after additionally counting a redundancy word line address when counting of the main word line address with respect to the mat address is completed, and then activate, latch, and output the toggle control signal when the delayed refresh signal is inputted, a toggle control unit configured not to toggle a sub word line driving signal when the activated toggle control signal is inputted and toggle the sub word line driving signal when the deactivated toggle control signal is inputted in case where a mat select signal of a corresponding mat is activated.

2. The semiconductor device according to claim 1, wherein the delayed refresh signal is obtained by delaying a refresh signal by a first time and inputted to perform a counting operation to increase the refresh address after a refresh operation for the refresh address is completed, and the refresh signal is a pulse signal which is inputted in synchronization with clock signal during a refresh operation.

3. The semiconductor device according to claim 2, wherein the control signal generation unit comprises:

an address counter unit configured to receive the delayed refresh signal according to whether an additional counting signal is activated or not, sequentially count the main word line address, a pre-additional counting signal, the mat address, and the sub word line address, and output the pre-additional counting signal;

an additional counting signal generation unit configured to generate the additional counting signal in response to the pre-additional counting signal when the refresh signal is applied; and a toggle control signal generation unit configured to generate the toggle control signal in response to the delayed refresh signal and the additional counting signal.

4. The semiconductor device according to claim 3, wherein the pre-additional counting signal is activated to select the redundancy word line address during a refresh operation.

5. The semiconductor device according to claim 4, wherein the address counter unit comprises:

a first counting block configured to receive the delayed refresh signal according to whether the additional counting signal is activated or not, sequentially count the main word line address and the pre-additional counting signal, and output the pre-additional counting signal; and a second counting block configured to receive the additional counting signal and sequentially count the mat address and the sub word line address.

6. The semiconductor device according to claim 5, wherein the first counting block comprises:

a first combination section configured to count the first bit of the main word line address in response to the additional counting signal and the delayed refresh signal;

a plurality of second flip-flops coupled in series to the first combination section and configured to sequentially count the main word line address; and a second combination section configured to count the pre-additional counting signal in response to the additional counting signal, the delayed refresh signal, and the last bit of the main word line address.

7. The semiconductor device according to claim 6, wherein the first combination section toggles the first bit of the main word line address whenever the delayed refresh signal is inputted while the additional counting signal is deactivated.

8. The semiconductor device according to claim 7, wherein the first combination section comprises:

a first AND gate configured to receive the inverted additional counting signal and the delayed refresh signal; and a first flip-flop configured to toggle the first bit of the main word line address in response to an output signal of the first AND to gate.

9. The semiconductor device according to claim 6, wherein the second combination section counts the pre-additional counting signal in response to the delayed refresh signal when the last bit of the main word line address is at a high level in case where the deactivated additional counting signal is inputted, and counts the pre-additional counting signal in response to the delayed refresh signal in case where the activated additional counting signal is inputted.

10. The semiconductor device according to claim 9, wherein the second combination section comprises:

a sub combination section configured to output an activated combination signal when the last bit of the main word line address is at a high level and the delayed refresh signal is inputted in case where the deactivated additional counting signal is inputted, and output an activated combination signal when the delayed refresh signal is inputted in case where the activated additional counting signal is inputted; and a third flip-flop configured to toggle the pre-additional counting signal in response to the combination signal.

11. The semiconductor device according to claim 10, wherein the sub combination section comprises:

a first NAND gate configured to receive the last bit of the main word line address and the inverted additional counting signal;

a second NAND gate configured to receive the additional counting signal and the delayed refresh signal; and a third NAND gate configured to receive output signals of the first and second NAND gates and output the combination signal.

12. The semiconductor device according to claim 5, wherein the second counting block comprises a plurality of fourth flip-flops coupled in series and configured to sequentially count the mat address and the sub word line address.

13. The semiconductor device according to claim 3, wherein the additional counting signal generation unit activates the additional counting signal when the refresh signal is inputted in case where the pre-additional counting signal is activated.

14. The semiconductor device according to claim 13, wherein the additional counting signal generation unit comprises a second AND gate configured to receive the pre-additional counting signal and the refresh signal.

15. The semiconductor device according to claim 3, wherein the toggle control signal generation unit resets the toggle control signal in a deactivation state in response to a reset signal.

16. The semiconductor device according to claim 15, wherein the toggle control signal generation unit activates, latches, and outputs the toggle control signal when the delayed refresh signal is inputted.

17. The semiconductor device according to claim 16, wherein the toggle control signal generation unit deactivates the toggle control signal at a time point where the additional counting signal is deactivated, when the activated additional counting signal and the delayed refresh signal are inputted.

18. The semiconductor device according to claim 17, wherein the toggle control signal generation unit deactivates the toggle control signal when an activated active signal is inputted.

19. The semiconductor device according to claim 18, wherein the toggle control signal generation unit comprises:

a fourth NAND gate configured to receive the inverted additional counting signal and the additional counting signal delayed by a second time;

a third AND gate configured to receive the active signal and an output signal of the fourth NAND gate; and a first latch section configured to output the toggle control signal in response to the inverted delayed refresh signal, an output signal of the third AND gate, and the reset signal.

20. The semiconductor device according to claim 19, wherein the first latch section comprises:

a fifth NAND gate configured to receive the inverted delayed refresh signal and an output signal of a sixth NAND gate and output the toggle control signal; and the sixth NAND gate configured to receive the output signal of the third AND gate, the output signal of the fifth NAND gate, and the reset signal.

* * * * *